United States Patent [19]

Weise

[11] 4,068,173
[45] Jan. 10, 1978

[54] FREQUENCY STABILIZED MICROWAVE SIGNAL SOURCE

[75] Inventor: Volker B. Weise, Redwood City, Calif.

[73] Assignee: GTE Automatic Electric Laboratories Incorporated, Northlake, Ill.

[21] Appl. No.: 756,317

[22] Filed: Jan. 3, 1977

[51] Int. Cl.² .................................................. H03B 3/04
[52] U.S. Cl. .................................. 325/184; 325/363; 331/1 A; 331/18
[58] Field of Search ............... 325/184, 148, 132, 363; 331/1 R, 1 A, 2, 18, 30, 34, 44, 47, 48, 49, 25; 332/19; 329/133, 131

[56] References Cited

U.S. PATENT DOCUMENTS

| | | | |
|---|---|---|---|
| 2,356,201 | 8/1944 | Beers | 329/123 |
| 3,350,658 | 10/1967 | Walker | 331/1 A |
| 3,486,134 | 12/1969 | Seidel | 325/184 |
| 3,573,650 | 4/1971 | Maltese | 331/1 R |
| 3,921,094 | 11/1975 | Schaible | 331/1 A |
| 4,030,045 | 6/1977 | Clark | 331/1 A |

OTHER PUBLICATIONS

A Frequency-Dividing Locked-In Oscillation Frequency Modulation Receiver, Proceeding of IRE, Dec. 1944, pp. 730-737.

Primary Examiner—Robert L. Griffin
Assistant Examiner—Tommy P. Chin
Attorney, Agent, or Firm—Russell A. Cannon; Leonard R. Cool

[57] ABSTRACT

The frequency of a microwave oscillator is stabilized by coupling a portion of the RF signal therefrom to an HF oscillator operating at a sub-multiple of the microwave frequency and producing a strong harmonic at the microwave frequency in order to cause the operation of the microwave and HF oscillators to be locked together. The HF signal frequency, which includes any drift in the microwave oscillator frequency, is divided down a specified amount and compared with the frequency of a stable crystal reference oscillator in a comparator. The output of the comparator is a DC error voltage which is proportional to any drift in the frequency of the microwave oscillator. This error voltage is applied to the microwave oscillator to cause the operating frequency thereof to be more nearly constant.

10 Claims, 3 Drawing Figures

FREQUENCY STABILIZED MICROWAVE SIGNAL SOURCE

BACKGROUND OF INVENTION

This invention relates to frequency stabilized signal sources for operating at microwave frequencies and more particularly to an improved technique for holding the operating frequency of a microwave signal source within prescribed limits.

It is required that the frequencies of microwave radio transmitters be maintained within specific limits. Although relatively simple automatic frequency control (AFC) circuits are employed to accomplish this function at low frequencies, more complex techniques are required to maintain the frequency of a microwave signal source fixed. A prior art stabilized microwave signal source comprises a microwave oscillator, a reference oscillator unit, and an AFC unit. In the reference oscillator unit, a relatively stable high frequency crystal oscillator provides a 113.5MHz signal, for example, which is amplified and multiplied by 17 up to 1930MHz, and mixed with a 2000MHz radio frequency (RF) signal from the microwave oscillator to produce a 70MHz intermediate frequency (IF) signal. This 70MHz signal contains the frequency variation related to the frequency drift of the microwave oscillator as well as that of the 113.5MHz reference crystal oscillator. This IF signal is amplified and divided down to a low frequency signal of about 5MHz. The divider may be similar to commercially available Motorola MC 1697P emitter coupled logic (MECL) divider units which operate at relatively low frequencies. Alternatively, the divider circuit could be of the type illustrated in the receiving system in U.S. Pat. No. 2,356,201, issued Aug. 22, 1944, for Frequency Modulation Signal Receiving System by G. L. Beers, and the associated article in Proceedings of the IRE, December 1944, page 730–737. A crystal oscillator of the AFC unit produces a very stable low frequency signal of 5MHz which is compared with the divided down 5MHz signal to produce a DC error voltage which is proportial to the frequency drift of the microwave oscillator. This error voltage is applied to the latter oscillator to shift its operating frequency back to 2000MHz. The 113.5MHz reference crystal oscillator and associated power amplifier, multiplier and microwave mixer of the reference oscillator unit are relatively expensive and difficult to tune up for the desired operation. An object of this invention is the provision of a stabilized microwave signal source which does not require a reference oscillator unit.

SUMMARY OF INVENTION

In accordance with this invention, a portion of the RF output signal of a microwave oscillator is coupled to an oscillator that operates at a high frequency (HF) which is a sub-multiple of the microwave signal frequency. It has been discovered that the high frequency oscillator will lock to the operating frequency of the microwave oscillator and follow any frequency variations in the latter. This high frequency signal, which follows any frequency drift in the RF signal from the microwave oscillator, is further divided down to produce a low frequency signal that is compared with the frequency of a reference signal from a very stable low frequency crystal reference oscillator. A DC error voltage which is obtained from this comparison is applied to the microwave oscillator to shift its operating frequency to compensate for any drift in the output frequency thereof.

BRIEF DESCRIPTION OF DRAWINGS

This invention will be more fully understood from the following detailed description, together with drawings in which.

DESCRIPTION OF PREFERRED EMBODIMENTS

Figure 1:
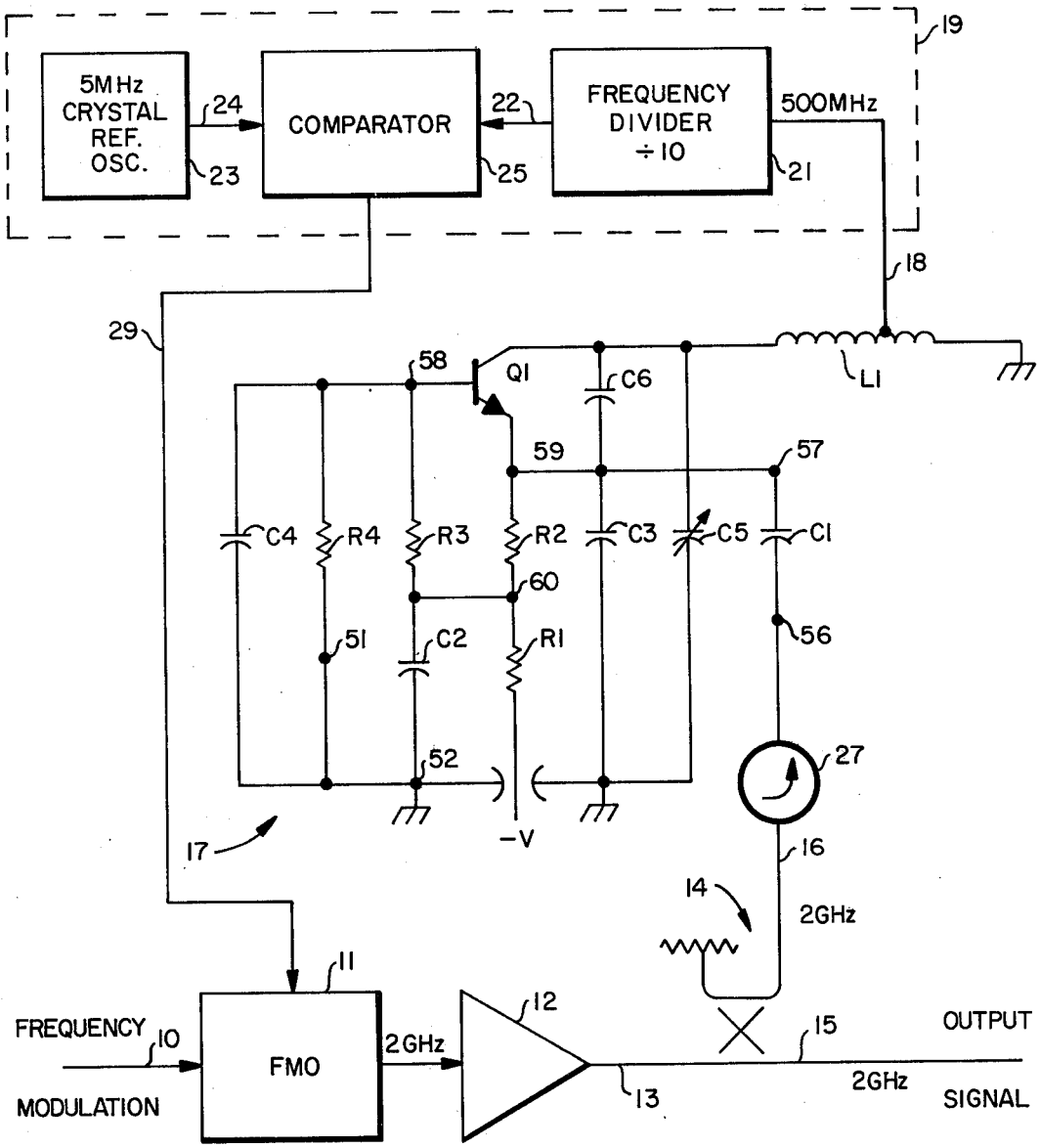
FIG. 1 is a schematic circuit and block diagram of a stablized microwave frequency signal source embodying this invention.

Referring now to FIG. 1, a microwave signal source providing a microwave frequency output signal on line 15 that has a stabilized frequency with minimal drift comprises a microwave oscillator 11, power amplifier 12 and directional coupler 14 which are connected in series with the output line 15; a high frequency (HF) oscillator 17; and an AFC unit 19 comprising a frequency divider 21, a stable low frequency crystal oscillator 23, and a comparator 25. The microwave oscillator 11 may, for example, be the source of RF signals which are generated by the transmitter section of a microwave radio. Such an oscillator 11 typically produces a 2GHz RF signal which may be frequency modulated by a signal on line 10. Any drift $\Delta f$ of the opeating frequency of oscillator 11 from 2GHz will appear in the amplified signals on lines 13, 15 and 16. The amplifier 12 may be a conventional microwave amplifier for amplifying RF signals. A portion of the amplified signal is coupled onto line 16 by the circuit element 14 which may be example be a 20dB directional coupler. This coupled signal on line 16 is passed by a microwave isolator 27 to a capacitor C1 which opeates as a high pass filter to pass 2GHz RF signals to the HF oscillator 17. The filter capacitor C1 also prevents any low frequency signals being passed to and from the isolator 27, the latter also preventing any signals from the oscillator 17 or filter capacitor C1 being applied to coupler 14 and coupled to output line 15.

It has been discovered that if the high frequency oscillator 17 is designed to operate at a frequency which is a sub-multiple of the 2GHz RF signal frequency produced by oscillator 11, and to produce and support a harmonic signal at that 2GHz frequency, that the two oscillators 11 and 17 will become injection locked. By way of example, the frequency of HF oscillator 17 may be 500MHz, which is one quarter of the 2GHz RF frequency. The operating frequency of oscillator 17 will then be frequency and phased locked to the RF signal frequency produced by microwave oscillator 11 such that the frequency of the HF signal on line 18 will track the frequency of the RF signal on line 16. This means that the frequency of the RF signal on line 16 is divided down directly to a lower frequency on line 18. Any drift $\Delta f$ of the carrier frequency of the RF signal on line 16 will be proportionally reproduced in the output of the HF oscillator on line 18 as a frequency drift of $\Delta f/4$. There will be no additional frequency drift introduced by the HF oscillator 17 since the two oscillators 11 and 17 are now injectioned locked.

The HF oscillator 17 comprises a common base transistor Q1 having its emitter and base electrodes connected through series combinations of resistors R1 and R2 and resistors R1 and R3, respectively, to a negative supply potential −V. A capacitor C2 is connected between the junction 60 of resistors R1-R3 and a ground reference potential. The Q1 emitter electrode is connected to ground through a capacitor C3. The Q1 base electrode is also connected to ground through a capacitor C4 and a resistor R4. The Q1 collector electrode is connected to ground through a tapped inductor L1 and a variable capacitor C5. A feedback capacitor C6 is connected across the Q1 emitter and collector electrodes. The resistor R1 and capacitor C2 provide power supply filtering. The resistors R3 and R4 provide the proper base biasing of Q1, whereas capacitor C4 connects the Q1 base electrode to ground in the AC equivalent circuit. The resistor R2 is the emitter resistor of the transistor and together with resistor R1 determines the collector current of Q1. The ratio of the capacitance of capacitor C6 to that of capacitor C3 gives the proper positive feedback to cause the transistor circuit to oscillate, and together with inductor L1 and capacitor C5 determine its frequency of oscillation. The inductor L1 is tapped to provide the desired output power level for driving the device comprising frequency divider 21. The value of the capacitance of capacitor C1 affects the frequency range over which the oscillator 17 stays locked to the carrier frequency of the microwave oscillator 11.

Figure 2:
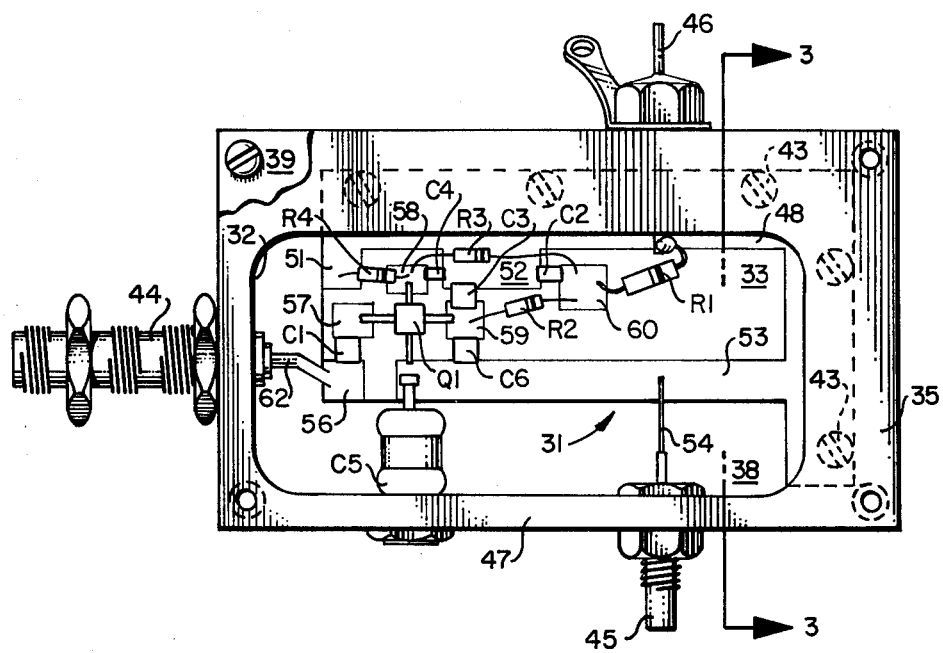
FIG. 2 is a top plan view of a microwave strip transmission line embodiment of the oscillator 17 in FIG. 1.
Figure 3:
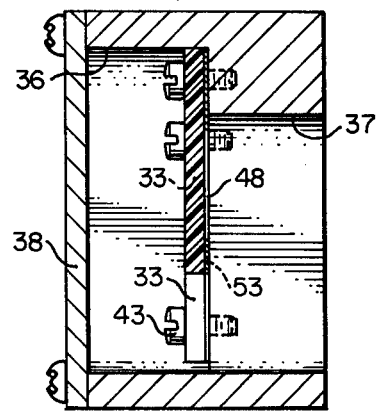
FIG. 3 is a section view of the stripline oscillator taken along lines 3—3 in FIG. 2.

Since the HF oscillator 17 must support both RF signal frequencies and HF signal frequencies, the oscillator is preferably a stripline oscillator wherein the circuit pattern and elements thereof are formed on and are a part of a printed circuit stripline structure 31 in a microwave cavity 32 (see FIGS. 2 and 3). Q1 in this structure may be a device having a pair of emitter electrodes. The stripline structure 31 comprises a plurality of electrically conductive pads and lines of metal formed on a dielectric substrate 33 which is supported in the middle of the cavity 32 as is described more fully hereinafter. The cavity is dimensioned to be resonant at 2GHz and comprises a body 35 having openings 36 and 37 in the top and bottom walls thereof and plates 38 and 39 covering associated openings. The bottom opening 36 is somewhat larger than the other opening 37 (see FIG. 3) in order to provide shoulders in the cavity to which the substrate 33 is attached by screws 43. The 2GHz and 500MHz signals on lines 16 and 18 are coupled to and from the cavity through coaxial connectors 44 and 45, respectively. The DC supply voltage −V is connected to the inside of the cavity through a feedthrough capacitor 46. The variable capacitor C5 extends through a wall 47 of the cavity and has a screwdriver adjustment on the outside thereof for adjusting the resonant frequency of oscillator 17 to be the desired operating frequency.

An electrically conductive line 48 in the stripline structure extends around adjacent edges of the substrate 33. When the substrate is mounted in the block 35 by screws 43, this line 48 is electrically connected to the conductive block 35 which is connected to the ground reference potential (not shown). Conductive tabs 51 and 52 extend from the strip 48 for connecting circuit elements to ground. A narrow elongated conductive line 53, which operates as an inductor at high frequencies and corresponds to the tapped inductor L1 in FIG. 2, has one end thereof connected to the ground strip 48. The line 54 from the output connector 45 is connected to an intermediate point on line 53. The other end of line 53 is connected to one end of the discrete capacitor C5. The other end of this capacitor C5 is connected to the block 35 which is grounded.

Conductive pads 56-60, which are spaced from the ground strip 48, are also formed on the substrate 33, these pads being designated by the same numerals as are employed to designate corresponding points in FIG. 1. The two emitter electrodes of Q1 are connected to associated pads 57 and 59. The base and collector electrodes of the transistor are connected to pad 58 and the other end of the conductive line 53, respectively. The center conductor 62 of the input connector 44 is connected to pad 56 and through a capacitor C1 which is a chip capacitor to pad 57, and thus to one of the Q1 emitter electrodes. The other emitter electrode is connected from the pad 59 through a chip capacitor C3 to a tab 52 on the ground line 48; through a chip capacitor C6 to the stripline 53; and through a discrete resistor R2 to pad 60. The pad 60 is also connected through discrete resistors R1 and R3 and a chip capacitor C2 to connector 46, to pad 58 (and thus a Q1 base electrode), and to ground pad 52, respectively. The Q1 base electrode and associated pad 58 are also connected through the discrete resistor R4 and chip capacitor C4 to associated ground pads 51 and 52.

The AFC unit 19 operates on the output signal of HF oscillator 17 to produce a DC error voltage on line 29 which is applied to the microwave oscillator 11 to cause it to compensate for any drift in the operating frequency thereof. The reference oscillator 23 in this AFC unit 19 is typically a 5MHz crystal oscillator operating in a temperature controlled oven such that its 5MHz operating frequency is extremely stable. Crystal reference oscillators are typically stable to within 5 parts per million (0.0005%) over a temperature range of −30° to +50° C. A 500MHz signal on line 18 is divided down by circuit 21 to this same 5MHz frequency. Since the circuit 21 operates at a frequency that is much lower than microwave, it may be any one of the commercially available devices for accomplishing such frequency division, e.g., an SP 8630B unit manufactured by Plessey which are relatively economical. The divided down 5MHz signal on line 22 is compared with the 5MHz reference signal on line 24 to produce the DC error voltage on line 29 which is proportional to the frequency drift $\Delta f$ in the 2GHz signal from the microwave oscillator. This error voltage is applied to oscillator 11 to cause the operating frequency thereof to be adjusted in the conventional manner to compensate for the variation $\Delta f$ in the frequency of the output signal thereof.

In a system which was built and tested and which operated satisfactorily for its intended purpose, the microwave and HF oscillators 11 and 17 and reference oscillator 23 were designed to operate at frequencies of 2GHz, 500MHz and 5MHz, respectively. In the HF oscillator 17, the cavity effectively measured 50 by 25mm, with a depth of 18mm. The variable capacitor C5 there was a high Q variable air capacitor, the other capacitors being chip capacitors. The resistors R1-R4 were discrete metal film components. The elements of this HF oscillator had the following values:

| | |
|---|---|
| R1 | 4700 ohms |
| R2 | 4700 ohms |
| R3 | 560 ohms |
| R4 | 270 ohms |
| C1 | 2.7 pico farads |
| C2 | 2.7 pico farads |
| C3 | 100 pico farads |

-continued

| | |
|---|---|
| C4 | 100 pico farads |
| C5 | 0.8–10 pico farads |
| C6 | 1.5 pico farads |
| L1 | 2.5 mm × 32mm |
| V | −12 volts |

The transistor in this oscillator was a Motorola MRF 902 transistor which produces strong harmonics at 2GHz. Alternatively, the transistor Q1 may be an Amperex BFR 49. The divider circuit 21 in this system comprises a Plessey SP 8630B frequency divider which divided the output signal of oscillator 17 on line 18 by 10.

In this system which was built and successfully operated, the locking range of the oscillator 17 was approximately ±70MHz of 2GHz for a coupled signal on line 16 of +8DBm. The locking range will change slightly with the level of the coupled input signal and the value of the capacitance of C1. When the oscillators 11 and 17 were injection locked, they remained in the locked state as the supply voltage varied from approximately −5 to approximately −23 volts.

Although this invention is described in relation to a specific embodiment thereof, modifications and variations will occur to these skilled in the art. By way of example, the transistor Q1 may be connected in other than a common base configuration. Also, the high pass filter capacitor C1 may be a band pass filter having appropriate frequency characteristics. The scope of this invention is therefore to be determined from the attached claims rather than the above detailed description.

What is claimed is:

1. A stabilized microwave signal source comprising:
a first oscillator which is a microwave oscillator for operating at a radio frequency (RF) $f_o$ which may have a frequency drift $\Delta f$ therefrom;
a second oscillator which is a stable crystal oscillator producing a reference signal having a stable low frequency reference frequency $f_R$;
a third oscillator for operating at a frequency $f_S$ which is a sub-multiple of the microwave frequency $f_o$, said third oscillator producing a harmonic signal at the RF frequency $f_o$, the frequency $f_S$ being less than the microwave frequency $f_o$;
first means for coupling a portion of the RF signal from said first oscillator to said third oscillator for causing the operation of these oscillators to be locked together such that the operating frequency of said third oscillator remains the same sub-multiple of the operating frequency of said first oscillator and follows any frequency drift $\Delta f$ in the latter;
second means for dividing the frequency $f_S$ of a signal down to the frequency $f_R$;
third means coupling the output signal of said third oscillator to said second/dividing means;
fourth means for comparing the frequency of the divided down signal from said second means with the stable reference frequency $f_R$ for producing a DC control voltage that is proportional to the difference therebetween; and
fifth means coupling the control voltage to said first oscillator for causing the operating frequency thereof to remain more nearly equal to the frequency $f_o$ to compensate for frequency drift $\Delta f$ in said first oscillator.

2. The stabilized microwave signal source according to claim 1 wherein said third oscillator is a high frequency (HF) oscillator.

3. The stabilized microwave signal source according to claim 2 wherein said third/HF oscillator is operative for producing a harmonic at a frequency which is equal to the microwave frequency $f_o$ and which has a power level sufficient to cause injection locking of said first and third oscillators.

4. The stabilized microwave signal source according to claim 3 wherein said third/HF oscillator is located in a microwave frequency cavity which is dimensioned to support oscillations at the frequency $f_o$ and subharmonics of $f_o$.

5. The stabilized microwave signal source according to claim 4 wherein said first means includes a microwave isolator operating at the frequency $f_o$ and being located between said first and third oscillators.

6. The stabilized microwave signal source according to claim 5 wherein said first/coupling means further comprises filter means located between said isolator and said third oscillator and having a frequency characteristic for passing said RF signal.

7. The stabilized microwave signal source according to claim 4 wherein said third/HF oscillator is a stripline oscillator including a dielectric substrate, a conductive strip formed on said substrate and operating as an inductor at HF and microwave frequencies; a first capacitor electrically connected between said cavity body and said conductive strip, the capacitance and inductance of said first capacitor and said conductive strip, respectively, determining the initial HF operating frequency $f_S$ of said third oscillator; and a transistor having one of its collector, emitter and base electrodes connected to said conductive strip proximate connection of said first capacitor thereto, having an other one of its collector, emitter and base electrodes receiving coupled RF signals from said first oscillator, and having the third one of its collector, emitter and base electrodes connected to bias means which biases said transistor in said third oscillator to oscillate.

8. The stabilized microwave signal source according to claim 7 wherein said transistor is operative for producing harmonic signals at the RF frequency $f_o$ and having a signal strength sufficient to cause injection locking of said first and third oscillators.

9. The stabilized microwave signal source according to claim 8 including a second capacitor which is a chip capacitor on said substrate and having a capacitance for operating as a high pass filter for passing the microwave frequency signal of frequency $f_o$ and blocking the HF signal of frequency $f_S$.

10. The stabilized microwave signal source according to claim 9 including a third capacitor which is a chip capacitor that is a feedback element connected between a selected pair of the emitter, collector and base electrodes of said transistor for causing said third oscillator to oscillate.

* * * * *